United States Patent [19]

Campbell, Jr.

[11] Patent Number: 4,634,905
[45] Date of Patent: Jan. 6, 1987

[54] POWER-ON-RESET CIRCUIT HAVING A DIFFERENTIAL COMPARATOR WITH INTRINSIC OFFSET VOLTAGE

[75] Inventor: Jules D. Campbell, Jr., Austin, Tex.

[73] Assignee: Motorola, Inc., Schaumburg, Ill.

[21] Appl. No.: 779,370

[22] Filed: Sep. 23, 1985

[51] Int. Cl.⁴ ............... H03K 5/153; H03K 5/24; H03K 17/687

[52] U.S. Cl. .................. 307/594; 307/200 B; 307/354; 307/362; 307/597

[58] Field of Search .............. 307/200 B, 592, 594, 307/597, 601, 296 A, 354, 362, 363, 200 A; 365/226

[56] References Cited

U.S. PATENT DOCUMENTS

| | | | |
|---|---|---|---|
| 4,260,907 | 4/1981 | Winebarger | 307/592 X |
| 4,296,338 | 10/1981 | Thomas | 307/597 X |
| 4,367,423 | 1/1983 | Hornung | 307/597 |
| 4,428,020 | 1/1984 | Blanchard, Jr. | 307/200 A X |
| 4,466,074 | 8/1974 | Jindrick et al. | 307/200 A X |
| 4,473,759 | 9/1984 | Mahabadi | 307/592 X |

FOREIGN PATENT DOCUMENTS

| | | | |
|---|---|---|---|
| 190421 | 11/1982 | Japan | 307/597 |
| 20032 | 2/1983 | Japan | 307/592 |

*Primary Examiner*—Larry N. Anagnos
*Attorney, Agent, or Firm*—John A. Fisher; Jeffrey Van Myers; Robert L. King

[57] ABSTRACT

A power-on-reset circuit which functions with variations in process, temperature and supply voltage is provided. A differential comparator structure is provided which utilizes a differential pair of transistors and which has a substantially constant intrinsic offset voltage associated therewith. The intrinsic offset voltage is created by making one of the transistors of the differential pair of lightly doped depletion device and the other transistor a heavily doped depletion device. A second reference voltage is provided in response to a detected power-up voltage and is implemented with a voltage divider. Power-on-reset is provided in response to the relationship of the levels of the first and second reference voltages.

9 Claims, 4 Drawing Figures

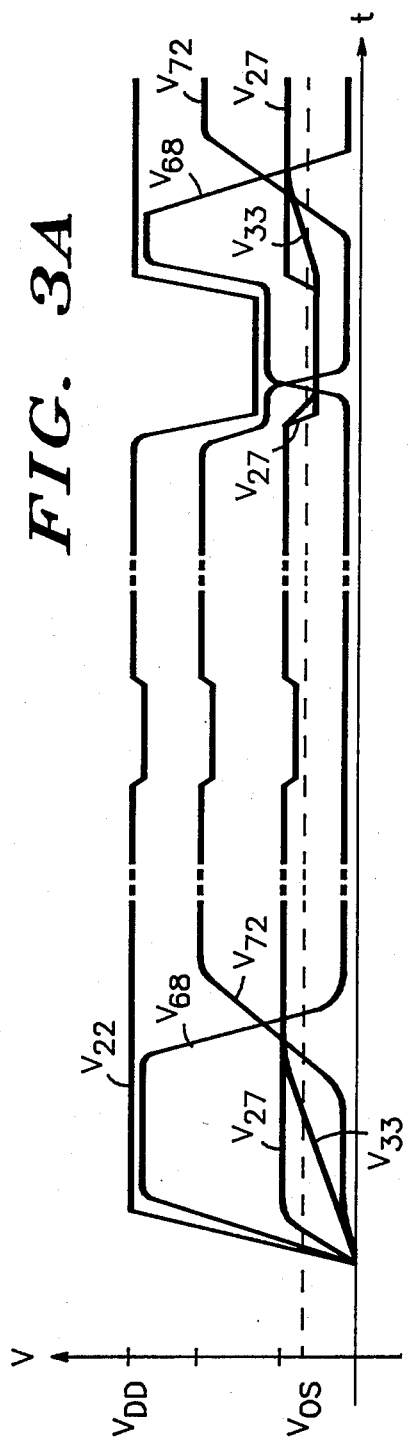
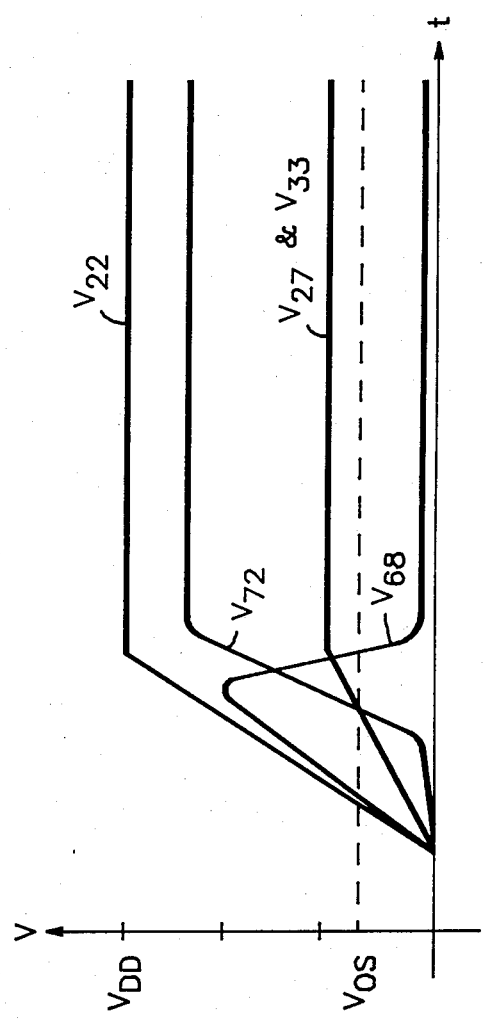
FIG. 3A
FIG. 3B

POWER-ON-RESET CIRCUIT HAVING A DIFFERENTIAL COMPARATOR WITH INTRINSIC OFFSET VOLTAGE

TECHNICAL FIELD

This invention relates generally to analog circuits, and more particularly, to power-on-reset circuits.

BACKGROUND ART

Power-on-reset (POR) circuits are numerous and commonly function to provide a signal in response to the presence of a predetermined voltage level. Since POR circuits commonly operate to control devices coupled to a multiplexed or shared data bus of a processor controlled data system, the output of the POR circuit must be enabled until the system is properly initialized. POR circuits allow other circuits in the system such as bus drivers to remain disabled until the system is under sufficient control of the processor to function properly. Known POR circuits are typically either level triggered or step response triggered but usually do not have both capabilities. Level triggered POR circuits have the disadvantage of providing pulse widths which may be too narrow to reset circuitry when very fast transitioning signals occur. A POR output pulse having a minimum pulse width is typically very desirable. Step response triggered POR circuits however have the disadvantage of not being very sensitive and do not always provide a retriggering output in response to a single voltage level transition. Other known POR circuits are also susceptible to erroneously responding to transient noise spikes coupled to the circuit via the supply voltage.

BRIEF DESCRIPTION OF THE INVENTION

Accordingly, an object of the present invention is to provide an improved power-on-reset circuit.

Another object of the present invention is to provide an improved power-on-reset circuit having well controlled trip point values.

Yet another object of the present invention is to provide an improved power-on-reset circuit having a comparator with an intentional predetermined intrinsic offset voltage.

In carrying out the above and other objects of the present invention, there is provided, in one form, a circuit for providing an output voltage and resetting the output voltage to a predetermined level upon coupling a predetermined power supply voltage to a power terminal of the circuit. Reference voltage means are coupled to the power terminal for providing a predetermined reference voltage in response to the predetermined power supply voltage. In a preferred form, delay means are coupled to the reference voltage means for delaying the reference voltage in response to a quickly transitioning power supply voltage. A differential comparator is provided with a differential input pair of transistors having predetermined different threshold voltages. A first of the transistors of the differential pair has a control electrode coupled to a predetermined voltage potential such as a second power terminal. A second of the transistors of the differential pair has a control electrode coupled to the reference voltage. The comparator compares the reference voltage with an offset voltage of the comparator created by the different threshold voltages and provides a control voltage in response thereto. Output means are coupled to the differential comparator for providing the output voltage in response to the control voltage.

These and other objects, features and advantages will be more clearly understood from the following detailed description taken in conjunction with the accompanying drawings.

BRIEF DESCRIPTION OF THE DRAWINGS

FIGS. 3(a) and 3(b) illustrate in graphical form signals associated with the operation of the circuit of FIG. 1.

DETAILED DESCRIPTION OF THE INVENTION

Figure 1:
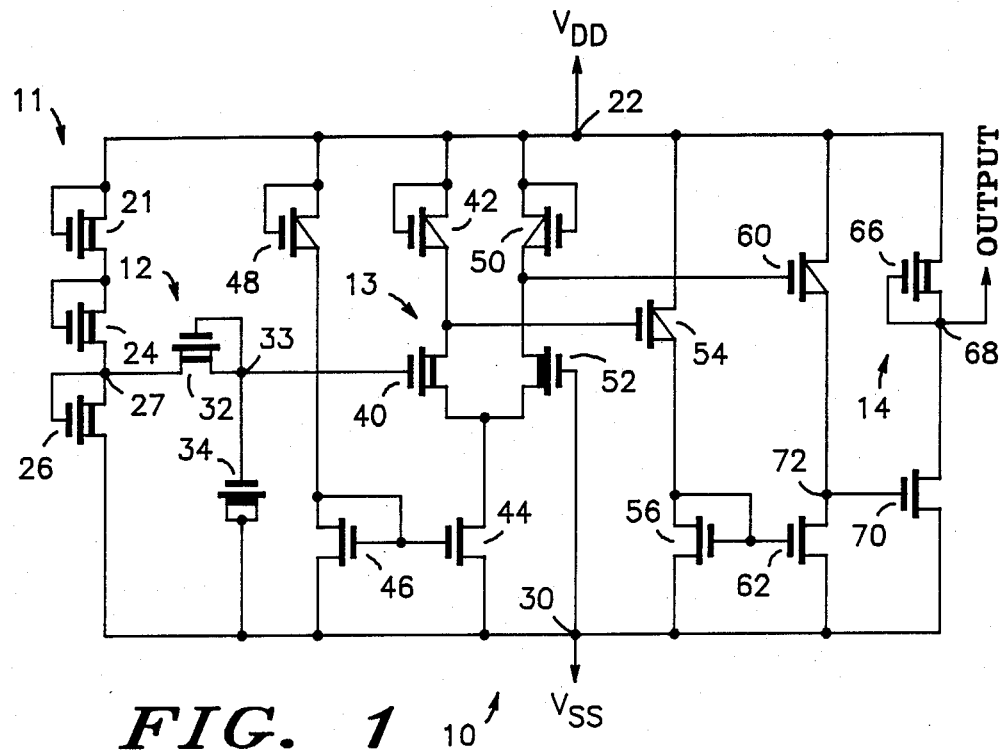
FIG. 1 illustrates in schematic form a power-on-reset circuit in accordance with the present invention.

Shown in FIG. 1 is a POR circuit 10 constructed in accordance with the present invention. POR circuit 10 generally comprises a reference voltage portion 11, a delay portion 12, a differential comparator portion 13 and an output portion 14. It should be understood that although specific N-channel MOS devices are shown, POR circuit 10 may be implemented by using another process technology, such as PMOS or CMOS.

In the illustrated form, reference voltage portion 11 comprises a lightly doped depletion type transistor 21 having a gate and drain connected together to a power supply terminal 22 for receiving a power supply voltage, say $V_{DD}$. A source of transistor 21 is connected to both a gate and a drain of a lightly doped depletion type transistor 24. A source of transistor 24 is connected to both a gate and a drain of a lightly doped depletion type transistor 26 at a node 27. A source of transistor 26 is connected to a terminal 30 for receiving a second power supply voltage, say $V_{SS}$. In the illustrated form, power supply voltage $V_{DD}$ is more positive than power supply voltage $V_{SS}$.

Delay portion 12 comprises a lightly doped depletion type transistor 32 having a drain connected to the source of transistor 24 and the drain of transistor 26 at node 27. Both a gate and a source of transistor 32 are connected together at a node 33 to a first electrode of a capacitor 34 implemented with a gate of a conventional heavily doped depletion transistor illustrated by the darkened transistor. A second electrode of capacitor 34 is formed by the connection of source and drain electrodes of the depletion transistor and is connected to power supply terminal 30. It should be well understood that in a preferred form the time constant of delay circuit 12 is longer for an increasing supply voltage at node 22 than for a decreasing supply voltage. The difference in time constants results from the choice of direction of the gate-source connection to node 33. For decreasing supply voltages at node 22, node 27 becomes the source of transistor 32 and node 33 becomes the gate/drain of transistor 32. Therefore, the conductivity of transistor 32 is increased. The asymmetry of charge and discharge times of capacitor 34 may be very useful for certain applications. The gate of transistor 32 may be connected to either node 27 or node 33 depending on the desired result.

Differential comparator portion 13 comprises a lightly doped depletion transistor 40 having a gate forming a first input connected to node 33. A drain of transistor 40 is connected to a source of an N-channel natural transistor 42. Both a gate and a drain of transistor 42 are connected together to power supply terminal 22. A source of transistor 40 is connected to a drain of an N-channel enhancement transistor 44. A source of transistor 44 is connected to power supply terminal 30, and a gate of transistor 44 is connected to both a gate and a drain of an N-channel enhancement transistor 46. A source of transistor 46 is connected to power supply terminal 30. The gate and drain of transistor 46 are connected to a source of an N-channel natural transistor 48. Both a gate and a drain of transistor 48 are connected together to power supply terminal 22. An N-channel natural transistor 50 has both a drain and a gate connected together to power supply terminal 22. A source of transistor 50 is connected to a drain of a heavily doped depletion transistor 52 illustrated by the darkened transistor. A gate of transistor 52 is connected to power supply terminal 30, and a source of transistor 52 is connected to the drain of transistor 44. A drain of an N-channel natural transistor 54 is connected to power supply terminal 22, and a source of transistor 54 is connected to both a drain and a gate of an N-channel enhancement transistor 56. A gate of transistor 54 is connected to a source of transistor 42. A source of transistor 56 is connected to power supply terminal 30. A drain of an N-channel natural transistor 60 is connected to power supply terminal 22, and a gate of transistor 60 is connected to a source of transistor 50. A source of transistor 60 is connected to a drain of an N-channel enhancement transistor 62. A gate of transistor 62 is connected to a gate of transistor 56, and a source of transistor 62 is connected to power supply terminal 30.

In other forms, the gate of transistor 40 could be coupled via delay portion 12 to a different reference potential other than the potential illustrated at node 27 in FIG. 1. Further, it should be noted that the gate of transistor 52 need not be connected specifically to the $V_{SS}$ potential but may be coupled to any reference voltage which is lower than the voltage applied to the gate of transistor 40 taking into consideration desired circuit performance.

Output portion 14 comprises a lightly doped depletion transistor 66 having a drain connected to power supply terminal 22, and both a gate and a source connected together to an output terminal 68. An N-channel enhancement transistor 70 has a drain connected to output terminal 68, a gate connected to the source of transistor 60 at a node 72, and a source connected to supply terminal 30.

In operation, POR circuit 10 functions to provide the output voltage at output terminal 68 as a high logic level voltage until supply voltage $V_{DD}$ at power supply terminal 22 is equal to or greater than a predetermined value at which time the output voltage at terminal 68 is reset to a low level of substantially $V_{SS}$ potential. FIGS. 3(a) and 3(b) illustrate circuit conditions to be described below for both a step and a ramp transition of supply voltage $V_{DD}$, respectively. POR circuit 10 utilizes differential comparator portion 13 to compare an input voltage at node 33 with a predetermined comparison voltage. The predetermined comparison voltage is an intrinsic offset voltage of the differential input transistors 40 and 52 of comparator portion 13. The present invention attains a very accurate comparison voltage by utilizing a constant difference between threshold voltages of transistors 40 and 52 to provide the intrinsic offset voltage of comparator 13. Further, the comparison voltage may be chosen to be smaller so that POR circuit 10 can react faster, if desired, to changes in the supply voltage $V_{DD}$. A discussion of how the constant difference in threshold voltages of transistors 40 and 52 is provided will follow a description of the functioning of POR circuit 10.

In the illustrated form, light depletion transistors 21, 24 and 26 function as a voltage divider reference portion. In a preferred form, transistors 21, 24 and 26 function to provide a reference voltage of substantially ($V_{DD}/3$) at node 27. Current variation with respect to power supply variation is a typical problem associated with enhancement transistor voltage dividers such as the divider formed by transistors 21, 24 and 26. Therefore, in a preferred form transistors 21, 24 and 26 are light depletion devices in order to minimize current variation. However, it should be apparent that the present invention may be practiced with many other types of reference voltage circuits in lieu of transistors 21, 24 and 27. Transistor 32 and capacitor 34 function as a resistor/capacitor (RC) network to provide a non-step increase in voltage at node 33 rather than a step increase in response to a step increase in supply voltage $V_{DD}$. In other words, transistor 32 and capacitor 34 function as a delay circuit to delay the time for coupling a change in the supply voltage to the differential input node 33. As illustrated in FIG. 3(a), a POR output pulse ($V_{68}$) having at least a predetermined minimum width results from a delayed increase in voltage at input node 33 in response to a fast step transition of the power supply towards $V_{DD}$ volts. A sharp transition in the POR output voltage results from the amplification provided by comparator portion 13. Transistors 40 and 52 function to provide an effective reference voltage resulting from an inherent offset to the second input of the differential pair of transistors 40 and 52 as will be described in detail below. Transistors 42 and 50 function as load devices for the differential pair of transistors 40 and 52, respectively. Transistor 48 functions as a bias current device to current mirror transistors 46 and 44. Transistor 48 is size ratioed with transistors 46 and 44 in a predetermined manner so that the gate-to-source voltage, $V_{GS}$, of transistors 46 and 44 remains low. Therefore, the drain current of transistor 44 remains in saturation for a wider range of operation of the differential amplifier formed by transistors 40, 42, 50 and 52. Transistor 48 is size ratioed with transistors 42 and 50 in a predetermined manner so that the D.C. biasing of transistors 46 and 44 and the differential outputs of comparator portion 13 at the drains of transistors 40 and 52 all proportionately track or follow supply voltage, processing and temperature variations. Transistors 54, 56, 60 and 62 function as a differential to single ended converter of comparator portion 13. The device sizes (i.e. gate width/length dimension) of transistors 56 and 62 are ratioed relatively large with respect to the device sizes of transistors 54 and 60 in order to maintain the gate-to-source voltage of transistors 56 and 62 low. Additionally, the saturation voltage of the drain of transistor 62 is kept low. A low saturation voltage at the drain of transistor 62 improves the total gain of comparator portion 13 which allows the output to readily change voltage level for smaller values of supply voltage $V_{DD}$. Output portion 14 functions to provide a high level output voltage at terminal 68 unless transistor 70 is conductive. Transistor 70 will not be conductive unless the output of comparator portion 13 has a high signal level. However, the output of comparator portion 13 will be a low logic level until the voltage level at input node 33 exceeds the predetermined reference voltage established by transistors 40 and 52.

Figure 2:
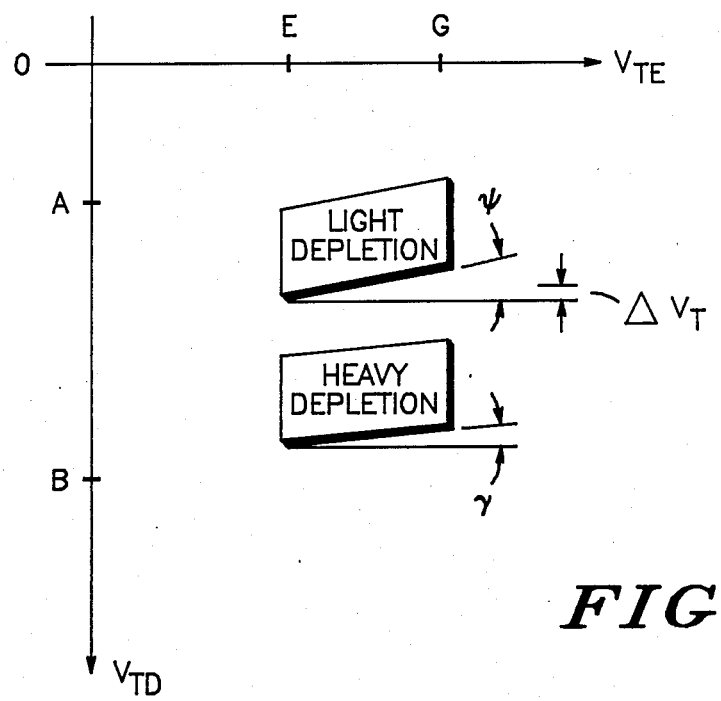
FIG. 2 illustrates in graphical form a relationship of threshold voltages in depletion transistors used in implementing the circuit of FIG. 1.

Referring to FIG. 2, a graph illustrates the range of threshold voltages for depletion and natural type transistors in a typical MOS process. The horizontal axis represents a range of threshold voltages for enhancement type devices varying from a value E to a value G. Magnitudes of values E thru G vary depending upon MOS process. The vertical axis represents a range of negative threshold voltages from A thru B for depletion type devices. Magnitudes of values A thru B also vary depending upon MOS process. The threshold voltages of natural devices is approximately zero volts. The slope of the threshold voltage curves is a function of substrate starting material. By choosing a particular substrate material, natural devices with a zero volt threshold may be fabricated. Light depletion devices usually have both an enhancement implant and a depletion implant. An enhancement threshold is dependent upon both an enhancement implant and the substrate starting material. The threshold voltage of light depletion devices varies substantially linearly with respect to enhancement threshold variations but is not constant due to interaction between both enhancement and depletion implants. From a speed standpoint, the threshold values at the top of the range illustrated which have an approximate value of "A" provide slower logic circuits than the threshold values at the bottom of the range. The variation of threshold voltage for light depletion devices between enhancement threshold voltage values E and G is illustrated by the angle labeled "$\psi$".

In the illustrated form, the range of threshold voltages for heavily depleted transistors is also within the range between values A and B but more negative than light depletion values. The threshold voltages of heavily depleted devices is usually determined only by a heavy depletion implant. Heavy depletion device thresholds vary linearly to a lesser degree with respect to enhancement threshold voltages. Since heavy depletion devices only have a heavy depletion implant, the heavy depletion device threshold voltage curve tends to be flatter. The variation at the bottom of the range of values for heavy depletion threshold voltages with respect to various enhancement threshold voltages is illustrated by the angle "$v$". Similarly, from a speed standpoint, the threshold values at the top of the range of heavy depletion thresholds provide slower logic circuits than the threshold values at the bottom of the range. It should be noted however that although $\psi > v$, the difference in threshold voltage between a heavily depleted transistor and a lightly depleted transistor remains reasonably constant. The amount of variation of lightly depleted devices with respect to heavily depleted devices is represented as a delta $V_T$ in FIG. 2 which is the difference in value of depletion threshold voltage for a predetermined device over a range of enhancement threshold values of E to G. Further, since the amount of threshold voltage variation between light and heavy depletion devices is relatively constant, the constant difference between light and heavy depletion threshold voltages can be used as an approximate voltage reference for comparator portion 13. This voltage reference is constructed as an inherent offset voltage associated with the differential comparator. Although the voltage reference is approximate with some variation being attributable to the delta $V_T$ variation, a very precise reference voltage is not required to provide an adequate POR output. In a preferred form, the voltage reference value is approximately one volt.

In response to the step increase in power supply voltage, the voltages at nodes 27 and 33 ($V_{27}$ and $V_{33}$, respectively) increase to the predetermined value ($V_{DD}/3$) at differing rates. The output voltage at node 68, $V_{68}$, initially transitions to nearly $V_{DD}$ volts before returning to zero volts in response to comparator portion 13 making transistor 70 conductive. POR circuit 10 however functions to insure that the output voltage has a sufficient minimum high level pulse width which is provided in part by the delay portion 12. The minimum pulse width insures adequate time to properly initialize circuitry to which the POR signal is coupled. Further illustrated in FIG. 3(a) is a slight decrease in supply voltage level from the $V_{DD}$ level. In response, the voltage level at nodes 27, 33 and 72 slightly decrease. However, the output voltage at node 68 does not vary and remains at a low level. Further illustrated in FIG. 3(a) is a decrease in power supply voltage which is significant enough to affect differential comparator portion 13 and a return in supply voltage to $V_{DD}$ volts. After the supply voltage has transitioned low enough to make the voltage at node 27 less than the reference offset voltage value, the output voltage at node 68 increases to a value slightly less than the supply voltage value. In the illustrated form, the supply voltage returns to near $V_{DD}$ in a step increase. In response, node 27 increases in potential and the output reset voltage at node 68 remains near $V_{DD}$. The output reset voltage will remain at near $V_{DD}$ a minimum amount of time until the delay period occurs. Thereafter, node 33 transitions past the offset voltage and the output reset voltage returns to a low logic level.

Shown in FIG. 3(b) is a graph illustrating circuit response for a ramp increase in the power supply voltage from zero volts to $V_{DD}$ volts. The voltages at nodes 27 and 33 increase to ($V_{DD}/3$) at approximately the same time due to the slow rise of the power supply potential. The output voltage $V_{68}$ increases proportionately with the power supply until the voltage at node 33 transitions above the reference offset voltage value. The voltage at node 72 increases as the voltage at node 22 increases. At a predetermined reference offset voltage value, comparator portion 13 is level triggered and transistor 70 is made conductive so that $V_{68}$ returns to substantially zero volts.

By now it should be apparent that a POR circuit having any input voltage ranging from a slowly ramping voltage to a step voltage characteristic provides a voltage level output. An important advantage of POR circuit 10 is the fact that the POR output signal is active at lower voltages than the comparator structure is operational. Further, the voltage level where the POR signal changes is well controlled over process, temperature and substrate bias variations. The POR circuit of the present invention is also self-contained within an I.C. design and requires no additional external components. The use of doping techniques to provide an intrinsic offset voltage as a reference voltage to a differential comparator is also more controllable than providing an offset voltage as a result of skewing the dimensions of differential input transistors. Skewed differential input transistors would result in an offset voltage which may vary significantly with processing, power supply and temperature variations. However, the present invention utilizes a comparator structure having an intrinsic reference voltage with which a power supply voltage is compared.

While an embodiment has been disclosed using certain assumed parameters, it should be understood that certain obvious modifications to the circuit or the given parameters will become apparent to those skilled in the art, and the scope of the invention should be limited only by the scope of the claims appended hereto.

I claim:

1. A circuit for providing an output voltage and resetting the output voltage to a predetermined level upon coupling a predetermined power supply voltage to a power terminal of the circuit, comprising:
   voltage divider means coupled to the power terminal for providing a predetermined portion of the power supply voltage;
   differential comparator means comprising a differential input pair of transistors having predetermined different threshold voltages, a first of the transistors having a control electrode coupled to a reference voltage terminal and a second of the transistors having a control electrode coupled to the voltage divider means, said comparator means comparing the predetermined portion of the power supply voltage with an offset voltage of the comparator created by the different threshold voltages and providing a control voltage in response thereto; and
   output means coupled to the differential comparator means for providing the output voltage in response to the control voltage.

2. The circuit of claim 1 further comprising:
   delay means coupled between the voltage divider means and the control electrode of the second transistor of the transistor pair, for coupling a time delayed change of the predetermined portion of the power supply voltage to the differential comparator means.

3. The circuit of claim 2 wherein the delay means comprises:
   a first depletion mode field effect transistor having a first current electrode coupled to the voltage divider means, a second current electrode coupled to the control electrode of the second of the differential input pair of transistors, and a control electrode coupled to a predetermined one of the first or second current electrodes; and
   an MOS capacitor having a first electrode coupled to the control electrode of the second of the differential input pair of transistors, and a second electrode coupled to the reference voltage terminal.

4. The circuit of claim 1 wherein the first transistor of the differential input pair of transistors is a heavily doped depletion mode field effect transistor and the second transistor of the differential input pair is a lightly doped depletion mode field effect transistor.

5. The circuit of claim 1 wherein the differential comparator means further comprise:

first and second load transistors each coupled to a predetermined one of the differential input transistors, respectively, for supplying first and second load currents;
current mirror means coupled to the differential input transistors for establishing a predetermined amount of current through the differential input transistors;
bias current means coupled to the current mirror means for providing a bias current to the current mirror means; and
differential input to single output conversion means having first and second inputs each of which is coupled to a current electrode of a predetermined one of the differential input transistors, for providing the control voltage to the output means.

6. The circuit of claim 1 wherein said voltage divider means comprises a plurality of series-connected diode configured transistors.

7. A power-on-reset circuit for providing an output reset voltage upon coupling a predetermined power supply voltage to a power terminal of the circuit, comprising:
   voltage divider means coupled to the power terminal for providing a predetermined percentage of the power supply voltage;
   delay means coupled to the voltage divider means for receiving the percentage of the power supply voltage and providing said percentage a predetermined delay period after being received;
   differential comparator means, having a first input coupled to the delay means, a second input coupled to a reference voltage terminal, and an output for providing a control signal, said comparator means having differential input depletion mode field effect transistor which have the substrates thereof doped in a manner to provide a predetermined offset voltage at the input of the comparator means; and
   output means coupled to the comparator means, for receiving the control voltage and providing the output reset voltage.

8. The power on reset circuit of claim 7 wherein the differential input depletion mode field effect transistors comprise a lightly doped depletion mode field effect transistor and a heavily doped depletion mode field effect transistor.

9. The power on reset circuit of claim 7 wherein the delay means comprises:
   a lightly doped depletion mode field effect transistor having a first current electrode coupled to the voltage divider means, a second current electrode coupled to the comparator means, and a control electrode coupled to a predetermined one of the first or second electrodes; and
   a heavily doped depletion mode field effect transistor configured as a capacitor by having a control electrode coupled to the comparator means, and both first and second current electrodes coupled to the reference voltage terminal.

* * * * *